(12) United States Patent
Doris et al.

(10) Patent No.: US 7,605,447 B2
(45) Date of Patent: Oct. 20, 2009

(54) HIGHLY MANUFACTURABLE SRAM CELLS IN SUBSTRATES WITH HYBRID CRYSTAL ORIENTATION

(75) Inventors: Bruce B. Doris, Brewster, NY (US); Gregory Costrini, Hopewell Junction, NY (US); Oleg Gluschenkov, Poughkeepsie, NY (US); Meikei Ieong, Wappingers Falls, NY (US); Nakgeuon Seong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/162,780

(22) Filed: Sep. 22, 2005

(65) Prior Publication Data

US 2007/0063278 A1 Mar. 22, 2007

(51) Int. Cl.
*H01L 29/06* (2006.01)
*H01L 29/04* (2006.01)
*H01L 27/11* (2006.01)

(52) U.S. Cl. .................. 257/618; 257/288; 257/627; 257/628; 257/903; 257/E27.098; 257/E21.661; 365/156; 365/182; 438/142; 438/198; 438/199; 438/213; 438/478; 438/479; 438/973

(58) Field of Classification Search ................ None
See application file for complete search history.

(56) References Cited

U.S. PATENT DOCUMENTS

| | | | |
|---|---|---|---|
| 5,384,473 A | * | 1/1995 | Yoshikawa et al. .......... 257/255 |
| 5,698,893 A | * | 12/1997 | Perera et al. ................ 257/627 |
| 6,642,536 B1 | * | 11/2003 | Xiang et al. .................. 257/19 |
| 2002/0079515 A1 | * | 6/2002 | Kuwazawa .................. 257/204 |
| 2003/0102518 A1 | * | 6/2003 | Fried et al. .................. 257/401 |
| 2004/0075141 A1 | * | 4/2004 | Maeda et al. ................ 257/347 |
| 2004/0245577 A1 | * | 12/2004 | Bhattacharyya ............. 257/369 |
| 2004/0256700 A1 | | 12/2004 | Doris et al. |
| 2005/0045995 A1 | | 3/2005 | Ieong et al. |
| 2005/0073874 A1 | * | 4/2005 | Chan et al. .................. 365/154 |
| 2006/0006440 A1 | * | 1/2006 | Liaw .......................... 257/296 |
| 2006/0157788 A1 | | 7/2006 | Joshi et al. |

* cited by examiner

*Primary Examiner*—Andy Huynh
*Assistant Examiner*—Hoang-Quan T Ho
(74) *Attorney, Agent, or Firm*—Scully, Scott, Murphy & Preser, P.C.; Joseph P. Abate, Esq.

(57) ABSTRACT

The present invention relates to a semiconductor device structure that includes at least one SRAM cell formed in a substrate. Such SRAM cell comprises two pull-up transistors, two pull-down transistors, and two pass-gate transistors. The pull-down transistors and the pass-gate transistors are substantially similar in channel widths and have substantially similar source-drain doping concentrations, while the SRAM cell has a beta ratio of at least 1.5. The substrate preferably comprises a hybrid substrate with at two isolated sets of regions, while carrier mobility in these two sets of regions differentiates by a factor of at least about 1.5. More preferably, the pull-down transistors of the SRAM cell are formed in one set of regions, and the pass-gate transistors are formed in the other set of regions, so that current flow in the pull-down transistors is larger than that in the pass-gate transistors.

12 Claims, 5 Drawing Sheets

US 7,605,447 B2

HIGHLY MANUFACTURABLE SRAM CELLS IN SUBSTRATES WITH HYBRID CRYSTAL ORIENTATION

FIELD OF THE INVENTION

This invention relates to semiconductor devices that comprise static random access memory (SRAM) cells, and more specifically to semiconductor devices that comprise SRAM cells having significantly enhanced cell stability. The present invention relates to a lithography-based fabrication process that can be used in fabricating such semiconductor devices.

BACKGROUND OF THE INVENTION

A static random access memory (SRAM) is a significant memory device due to its high speed, low power consumption, and simple operation. Unlike a dynamic random access memory (DRAM) cell, the SRAM does not need to regularly refresh the stored data and it has a straightforward design.

Each bit in a typical six-transistor SRAM (6T-SRAM) cell is stored on four transistors, generally referred to as load transistors (or pull-up transistors) and driver transistors (or pull-down transistors), that form a flip-flop circuit containing two cross-coupled inverters. This storage cell has two stable states which are used to denote 0 and 1. Two additional access transistors (or pass-gate transistors) serve to control the access to a storage cell during read and write operations.

To function properly, the SRAM cell, when charged, must hold a voltage level, either high (logic 1) or low (logic 0). When reading data from the cell, the cell current generated as the pass-gate transistor turns 'on' must not flip the voltage level at the internal cell nodes. To stabilize the cell, the driver or pull-down transistor is fabricated to have a higher conductance than the pass-gate transistor.

The ratio of the conductance of the pull-down transistor over the conductance of the pass-transistor therefore can be used as a basic metric to measure the stability of the SRAM cell or the ability of the cell to retain its data state. This conductance ratio is generally referred to as "beta ratio." The larger the beta ratio, the more stable the SRAM cell. Depending on the SRAM application, the beta ratio is typically at least about 1.5, and preferably ranges from about 1.8 to about 3.

The conductance of a transistor is approximately proportional to the effective carrier mobility $\mu_{eff}$ and the ratio of the device width to the channel length, i.e., W/L. Accordingly, the beta ratio of the SRAM cell can be approximated by the ratio of $\mu_{eff}(W/L)$ of the pull-down transistor over $\mu_{eff}(W/L)$ of the pass-gate transistor. Usually, the beta ratio of a SRAM cell is controlled by adjusting the W/L of the pull-down transistor relative to that of the pass-gate transistor. If the pull-down and the pass-gate transistors have the same channel length and effective carrier mobility, as in most cases, then the beta ratio becomes the ratio of the channel width of the pull-down transistor over the channel width of the pass-gate transistor.

Therefore, in most SRAM cells, the pull-down transistors are fabricated with a channel width that is approximately twice as large as that of the pass-gate transistors.

FIG. 1 presents a top-down view of an exemplary SRAM cell layout, which contains the active regions, isolation regions, gate structures, and contact structures that may be used to form the typical metal oxide semiconductor (MOS) transistors in a typical complementary metal oxide semiconductor (CMOS) SRAM cell. Specifically, pass-gate transistors 1 and 4 and pull-down transistors 2 and 3 are formed within connected active regions 12 and 14 (i.e., there is no isolation between the active region of the pass-gate transistor 1 or 4 and the active region of the pull-down transistor 2 or 3), and pull-up transistors 5 and 6 are formed within active regions 16 and 18. The active regions 12, 14, 16, and 18 are formed within a semiconductor substrate, which may preferably be a silicon substrate doped with n-type and p-type impurities in the vicinity of the p-channel transistors and the n-channel transistors, respectively, and are separated from one another by dielectric isolation regions 31-33. Gate structures 22 and 26 are arranged above active region 12 to form gates of pull-down transistor 2 and pass-gate transistor 1, respectively. Similarly, above active region 14, gate structures 24 and 28 are arranged to form gates of pull-down transistor 3 and pass-gate transistor 4, respectively. Consequently, active regions 16 and 18 each have two gate structures 22 and 24 arranged above them.

In FIG. 1, the active region 12 that forms the pass-gate transistor 1 and the pull-down transistor 2 has a first width W1 at a first region 12a, and a second width W2 at a second region 12b, while W1 is approximately only half of W2. Similarly, the active region 14 that forms the pull-down transistor 3 and the pass-gate transistor 4 also has a narrow region 14a of width W1 and a wide region 14b of width W2. In such a manner, the active regions of the pull-down transistors 2 and 3 are about twice as large as the active regions of the pass-gate transistors 1 and 4, thereby enhancing the beta ratio and ensuring the stability of the SRAM cell.

Note that in each of the connected active regions 12 and 14, a transition region exists between the narrow region and the wide region of the respective connected active region, where the device width changes drastically.

Advanced lithography is usually used for fabricating SRAM cells, due to the dimensional scalability provided by lithography technology. However, although advanced lithography is very effective for manufacturing device features of regular size, the transition region between the narrow region and the wide region of the connected active region of the SRAM cell presents a challenge to the lithography process. Consequently, the processing complexity and manufacturing costs for the SRAM cells increase significantly due to the presence of such a transition region.

SUMMARY OF THE INVENTION

The present invention solves the above-described problem by providing a SRAM structure with sufficient cell stability as well as device features of regular sizes that are particularly suitable for lithography-based manufacturing.

In one aspect, the present invention relates to a semiconductor device structure comprising at least one SRAM cell located in a substrate, wherein the at least one SRAM cell comprises at least two pull-up transistors, two pull-down transistors, and two pass-gate transistors, wherein the pull-down transistors and the pass-gate transistors are substantially similar in channel widths and have substantially similar source-drain doping concentrations, and wherein the at least one SRAM cell has a beta ratio of at least about 1.5.

The term "substantially similar" is hereby defined as two values differentiating by less than ±10% of the larger value.

In another aspect, the present invention relates to a method for fabricating a semiconductor device structure, comprising the steps of: forming a hybrid substrate that comprises at least a first set of regions and a second set of regions, wherein carrier mobility in the second set of regions differentiates from that in the first set of regions by a factor of at least about 1.5; and forming at least one SRAM cell in the hybrid substrate, while the at least one SRAM cell comprises two pull-up transistors, two pull-down transistors, and two pass-gate transistors, the two pull-down transistors are formed in one of the first and second sets of regions, the two pass-gate transistors are formed in the other of such first and second sets of regions, and the pull-down transistors and the pass-gate transistors are substantially similar in channel widths and have substantially similar source-drain doping concentrations, and wherein the at least one SRAM cell has a beta ratio of at least about 1.5.

In a preferred embodiment of the present invention, the substrate is a hybrid crystal orientation substrate having a first set of regions of a first crystal orientation, and a second set of regions of a second, different crystal orientation. Such a hybrid crystal orientation substrate is typically formed by a method comprising the steps of:

providing a bonded substrate comprising at least an upper semiconductor layer of the first crystal orientation and a lower semiconductor layer of the second crystal orientation;

selectively etching a portion of the bonded substrate to expose a surface of the lower semiconductor layer;

regrowing a semiconductor material on the exposed surface of the lower semiconductor layer, such semiconductor material having a crystal orientation that is substantially the same as the second crystal orientation; and planarizing the bonded substrate containing the regrown semiconductor material so that an upper surface of the upper semiconductor layer is substantially planar with an upper surface of the regrown semiconductor material, wherein the upper surface of the upper semiconductor layer defines one of such first and second sets of regions of the hybrid substrate, and wherein the upper surface of the regrown semiconductor material defines the other of such first and second sets of regions of the hybrid substrate.

In a further aspect, the present invention relates to a semiconductor device structure comprising at least one SRAM cell formed in a substrate, while the at least one SRAM cell comprises at least two pull-up transistors, two pull-down transistors, and two pass-gate transistors, the substrate comprises a hybrid crystal orientation substrate having at least a first set of regions of a first crystal orientation and a second set of regions of a second, different crystal orientation, the two pull-down transistors are located in one of the first and second sets of regions, and the two pass-gate transistors are located in the other of said first and second sets of regions, and wherein current carriers in the pull-down transistors have a higher mobility than those in the pass-gate transistors.

Preferably, both the pull-down transistors and the pass-gate transistors of the SRAM cell comprise n-channel field effect transistors, wherein the first set of regions of the hybrid crystal orientation substrate comprise silicon with a (100) surface, wherein the second set of regions of the hybrid crystal orientation substrate comprise silicon with a (110) surface, wherein the pull-down transistors of the SRAM cell are formed in the first set of regions, and wherein the pass-gate transistors are formed in the second set of regions.

In a still further aspect, the present invention relates to a method for forming a semiconductor device structure, comprising the steps of:

forming a hybrid crystal orientation substrate having at least a first set of regions of a first crystal orientation and a second set of regions of a second, different crystal orientation; and forming at least one SRAM cell in said hybrid crystal orientation substrate, wherein such a SRAM cell comprises at least two pull-up transistors, two pull-down transistors, and two pass-gate transistors, the two pull-down transistors are formed in one of the first and second sets of regions of the hybrid crystal orientation substrate, and the two pass-gate transistors are formed in the other of said first and second sets of regions of the hybrid crystal orientation substrate, and wherein current carriers in the pull-down transistors have a higher mobility than those in the pass-gate transistors.

Other aspects, features and advantages of the invention will be more fully apparent from the ensuing disclosure and appended claims

DETAILED DESCRIPTION OF THE INVENTION AND PREFERRED EMBODIMENTS THEREOF

Figure 1:
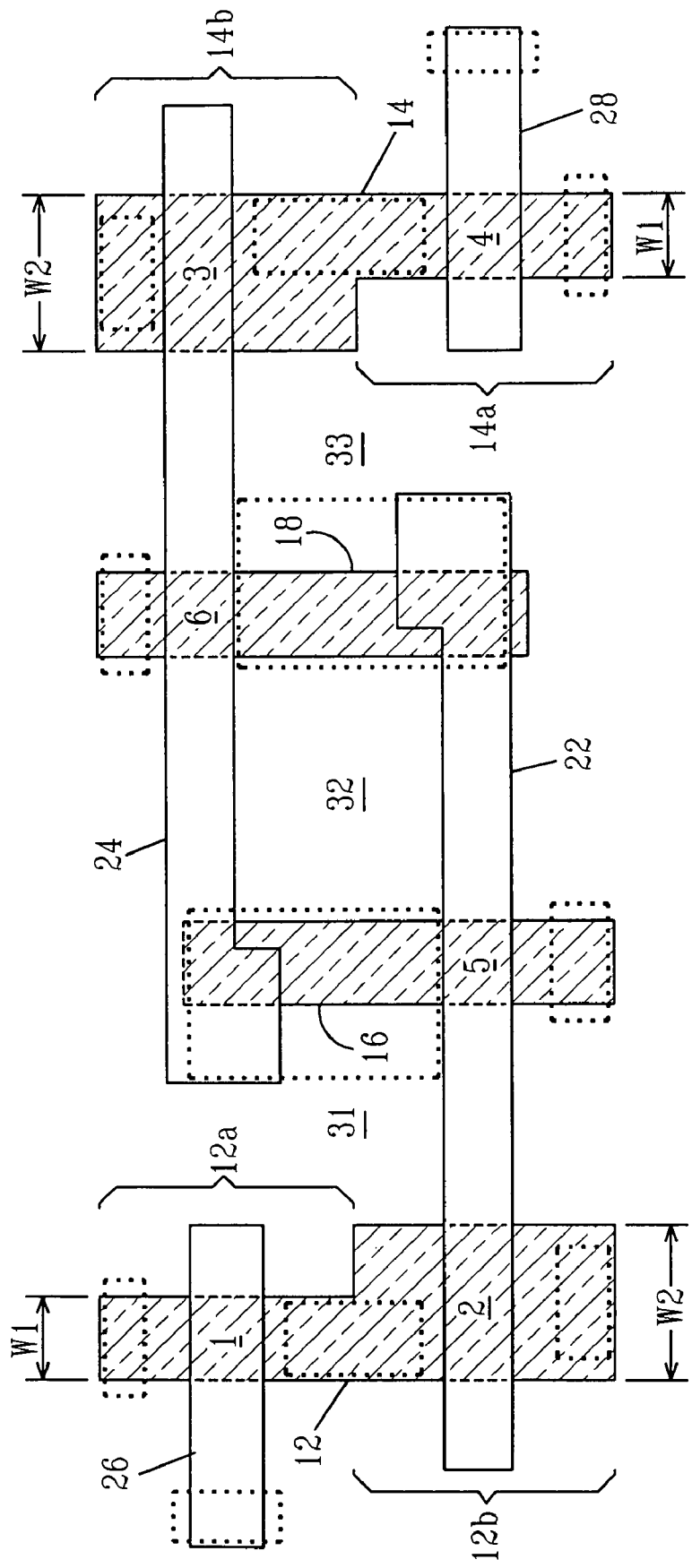
FIG. 1 shows the top view of a conventional 6T-SRAM cell with a pull-down transistor and a pass-gate transistor formed in a connected active region with varying channel width.

The following U.S. patent applications are incorporated herein by reference in their entireties for all purposes:

U.S. patent application Ser. No. 10/250,241 filed on Jun. 17, 2003 for "HIGH PERFORMANCE CMOS SOI DEVICES ON HYBRID CRYSTAL-ORIENTED SUBSTRATES," which was published on Dec. 23, 2004 as U.S. Patent Application Publication No. 2004/0256700; and U.S. patent application Ser. No. 10/932,982 filed on Sep. 2, 2004 for "ULTRA-THIN SILICON-ON-INSULATOR AND STRAINED-SILICON-DIRECT-ON-INSULATOR WITH HYBRID CRYSTAL ORIENTAITONS," which was published on Mar. 3, 2005 as U.S. Patent Application Publication No. 2005/0045995.

The present invention provides a SRAM cell structure that contains pull-down transistors and pass-gate transistors of substantially similar channel widths, which are suitable for fabrication using advanced lithography technology. Such a SRAM cell is concurrently characterized by a beta ratio of at least about 1.5, preferably from about 1.8 to 3, more preferably from about 2 to about 3, and most preferably from about 2.5 to about 3, which ensures the stability of the SRAM cell.

The high beta ratio of the SRAM cell of the present invention is provided by increasing the ratio of carrier mobility in the respective active regions of the pull-down and pass-gate transistors, while allowing channel widths of the pull-down and pass-gate transistors to be substantially the same.

More specifically, the present invention provides a hybrid substrate comprising a set of regions in which mobility of a specific type of charge carriers (i.e., holes or electrons) is enhanced, and another set of regions in which mobility of such specific type of charge carriers is degraded. By fabricating the pull-down transistor in one set of regions and the pass-gate transistor in the other set of regions, mobility of the charge carriers in the pull-down transistor can be enhanced, while mobility of the charge carrier in the pass-gate transistor can be degraded, thereby providing a current gain in the pull-down transistor that is significantly higher than that in the pass-gate transistor for maintaining a sufficiently high beta ratio.

Such hybrid substrate may comprise any semiconductor material, which includes, but is not limited to: Si, SiC, SiGe, SiGeC, Ge alloys, GaAs, InAs, InP, as well as other III-V or II-VI compound semiconductors.

In one embodiment of the present invention, the hybrid substrate comprises two or more substrate materials of different compositions. For example, one substrate material may comprise silicon, and the other substrate material may comprise germanium. In another example, one substrate material may comprise unstrained silicon, while the other comprises strained silicon. Since carrier mobility may vary with the composition of the substrate material, different semiconductor materials can be employed to form a hybrid substrate in which the current gain in the pass-gate transistors is selectively reduced to increase the beta ratio of the SRAM cell. Such a hybrid substrate containing different substrate material compositions is referred to herein as a hybrid composition substrate.

In another embodiment of the present invention, a hybrid substrate that comprises different regions of different crystal orientations (which is referred to herein as a hybrid crystal orientation substrate) is used to selectively reduce the current flow in the active regions of the pass-gate transistors, thereby increasing the beta ratio of the SRAM cell.

Functionality of such hybrid crystal orientation substrates is based on the anisotropy of carrier mobility in the semiconductor crystals. Specifically, the mobility of charged carries such as electrons and holes varies with the crystal orientation of the semiconductor substrate. For example, hole mobility is enhanced for a (110) surface in comparison to a (100) surface in silicon substrate, but electron mobility is degraded by a factor of about 2.5 for the (110) surface as compared to the standard (100) surface.

Therefore, by fabricating the pull-down transistors of the SRAM cell in regions having a crystal orientation that enhances the mobility of the respective carriers in such pull-down transistors (i.e., electrons for n-channel pull-down transistors and holes for p-channel pull-down transistors), and the pass-gate transistors in different regions having a different crystal orientation that degrades the mobility of the respective carriers, a carrier mobility differential can be formed between the active regions of the pull-down transistors and the pass-gate transistors of such SRAM cell. Consequentially, the relative current gains in the active regions of the pull-down transistors and the pass-gate transistors are differentiated, even if the channel widths of the pull-down and pass-gate active regions are exactly the same. Therefore, the beta ratio of the SRAM cells can be effectively enhanced, without having to provide different channel widths for the pull-down transistors and the pass-gate transistors.

Such carrier mobility anisotropy also exists in other semiconductor materials, such as other group IV semiconductor materials as well as group III-V and II-VI compounds, and the hybrid crystal orientation technology therefore is readily applicable to SRAM cells formed of such other semiconductor materials. By fabricating the pull-down transistors and the pass-gate transistors of the SRAM cells in substrate regions of suitable crystal orientations, which can be readily determined based on the crystal structure of such other semiconductor materials, the beta ratio of such SRAM cells can be advantageously enhanced, while maintaining the same channel widths for the pull-down transistors and the pass-gate transistors.

The hybrid crystal orientation substrate of the present invention can be formed, for example, by a method that includes wafer bonding, selective etching and regrowth of a semiconductor layer, as described, for example, in U.S. patent applications Ser. Nos. 10/250,241 and 10/932,982, the content of which is incorporated herein by reference in its entirety for all purposes.

FIGS. 2A-2F illustrates the basic processing steps that can be used to fabricate a hybrid crystal orientation substrate suitable for forming a SRAM cell of the present invention.

Figure 2A:
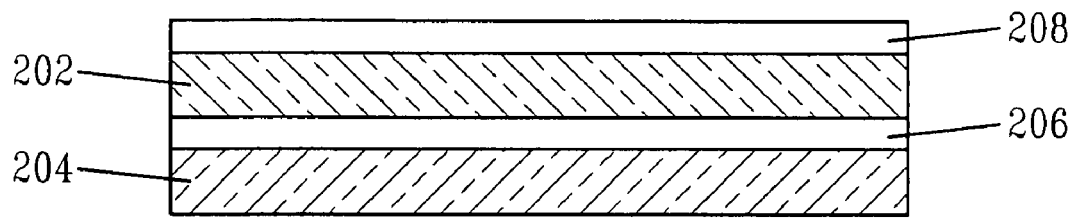
FIGS. 2A-2F illustrates the processing steps for forming an exemplary hybrid substrate that can be used to fabricate a SRAM cell, according to one embodiment of the present invention.

In FIG. 2A, an upper semiconductor layer 202 having a first crystal orientation and a lower semiconductor layer 204 having a second, different crystal orientation are provided and bonded together to form a bonded substrate.

The upper and lower semiconductor material layers 202 and 204 may comprise any semiconductor material, including, but not limited to: Si, SiC, SiGe, SiGeC, Ge alloys, GaAs, InAs, InP, as well as other III-V or II-VI compound semiconductors. Such semiconductor layers may comprise a doped or undoped bulk wafer, a bulk wafer containing an ion implanted region, such as an $H_2$ implant region that can be used to split a portion of such wafer, a preformed SOI wafer, or a layered semiconductor structure such as, for example, Si/SiGe. In one preferred embodiment, both the upper and lower semiconductor layers 202 and 204 comprise a Si-containing semiconductor material.

The thickness of the upper semiconductor layer 202 may vary depending on the initial starting wafers used to form the substrate. Preferably, the upper semiconductor layer has an initial thickness from about 5 to about 100 nm, which can be subsequently thinned to a thickness of 40 nm or less by planarization, grinding, wet etching, dry etching or any combination thereof. More preferably, the upper semiconductor layer is thinned by oxidation and wet etching to achieve the desired thickness to provide a thin silicon-on-insulator structure.

The thickness of the lower semiconductor layer 204 may also vary depending on the initial starting wafers used to form the substrate. Preferably, the lower semiconductor layer has a thickness from about 5 nm to about 200 nm, and more preferably from about 5 to about 100 nm.

The upper and lower semiconductor layers 202 and 204 can be directly bonded together for fabrication of a hybrid crystal orientation substrate having at least two sets of bulk-Si regions of different crystal orientation.

Alternatively, one or more interfacial layers may be provided between the upper and lower semiconductor layers, for fabrication of hybrid orientation substrates containing alternating bulk-Si regions and SOI regions, or two sets of SOI regions of different crystal orientations.

Preferably, but not necessarily, an insulating layer 206 is provided between 202 and 204. Such an insulating layer 206 has a variable thickness depending upon the initial wafers used to create the substrate. Typically, however, the insulating layer 206 has a thickness from about 1 nm to about 500 nm, with a thickness from about 1 nm to about 50 nm being more typical. The insulating layer 206 is an oxide or other like insulator material that is formed on one or both of the wafers prior to bonding.

Further, a surface dielectric layer 208 may be provided over the upper semiconductor layer 202. The surface dielectric layer 208 is preferably an oxide, nitride, oxynitride or other insulating layer that is either present in one of the initial wafers before bonding, or formed atop the first semiconductor layer 202 after wafer bonding by either a thermal process (i.e., oxidation, nitridation or oxynitridation) or by deposition. Notwithstanding the origin of the surface dielectric layer

208, the surface dielectric layer 208 has a thickness from about 3 nm to about 500 nm, with a thickness from about 5 nm to about 20 nm being more typical.

Bonding of the upper and lower semiconductor material layers 202 and 204 is achieved by first bringing the two wafers into intimate contact with other, optionally applying an external force to the contacted wafers, and then heating the two contacted wafers under conditions that are capable of bonding the two wafers together. The heating step may be performed in the presence or absence of an external force. The heating step is typically performed in an inert ambient at a temperature from about 200° to about 1050° C. for a time period from about 2 to about 20 hours. More typically, the bonding is performed at a temperature from about 200° to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$. Other bonding conditions are also contemplated herein, including bonding that is performed at ambient temperature of from about 20° C. to about 40° C.

Figure 2B:
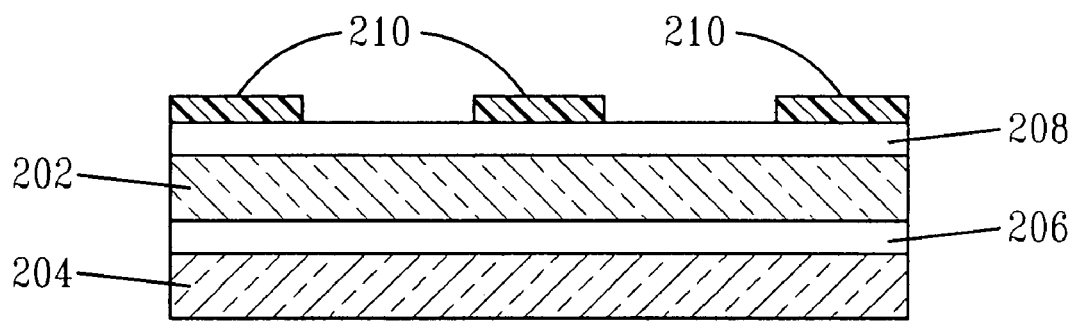
Figure 2C:
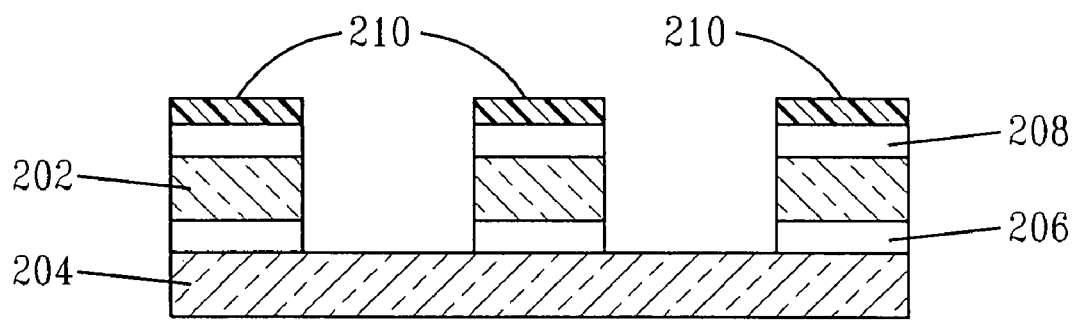

Referring now to FIG. 2B, a patterned mask 210 is then formed on a predetermined portion of the bonded substrate of FIG. 2A, so as to define a set of protected regions and a set of unprotected regions on the substrate surface. The patterned mask 20 allows selectively etching at the unprotected regions, so as to remove a portion of the surface dielectric layer 208, a portion of the first semiconductor layer 202, and a portion of the insulating layer 206, thereby exposing a surface of the second semiconductor layer 204, as shown in FIG. 2C. The selective etching may be performed utilizing a single etching process or multiple etching steps, including, but not limited to: a dry etching process such as reactive-ion etching, ion beam etching, plasma etching or laser etching, or a wet etching process wherein a chemical etchant is employed or any combination thereof. In a preferred embodiment of the present invention, reactive-ion etching (RIE) is used for such selective etching. After etching, the mask 210 is then removed from the structure shown in FIG. 2C utilizing a conventional resist stripping process.

Figure 2D:
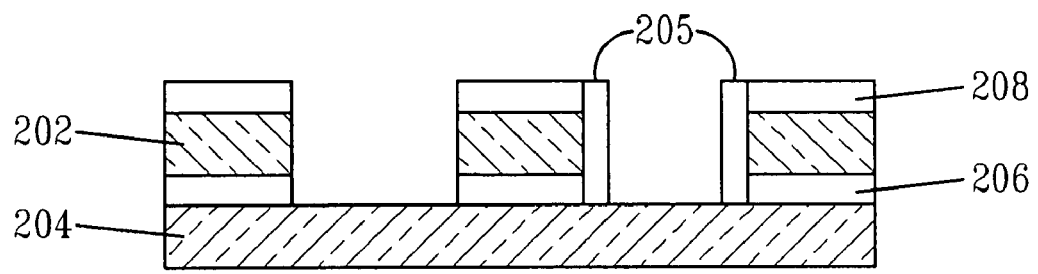

A liner or spacer 205 can optionally be, but not necessarily, formed on the exposed sidewalls of one or more trenches formed by the selective etching, as shown in FIG. 2D. Such liner or spacer 205 may comprise an insulating material such as, for example, an oxide.

After forming the optional liner or spacer 205, a semiconductor material 212 is regrown in the trenches formed by the selective etching over the exposed surface of the second semiconductor layer 204. Such semiconductor material 212 may comprise any Si-containing semiconductor, such as Si, strained Si, SiGe, SiC, SiGeC or combinations thereof, which is capable of being formed utilizing a selective epitaxial growth method.

In accordance with the present invention, such semiconductor material 212 has a crystallographic orientation that is the same as the crystallographic orientation of the second semiconductor layer 204. A portion of such semiconductor material is regrown in trenches without any liner or spacer, to form a semiconductor structure 212*a* that is contiguous with the upper semiconductor layer 202. Another portion of such semiconductor material is regrown in trenches with the liner or spacer, to form a semiconductor structure 212*b* that is isolated from the upper semiconductor layer 202 by the insulating layer 206 and liner or spacer 205, as shown in FIG. 2E.

Figure 2E:
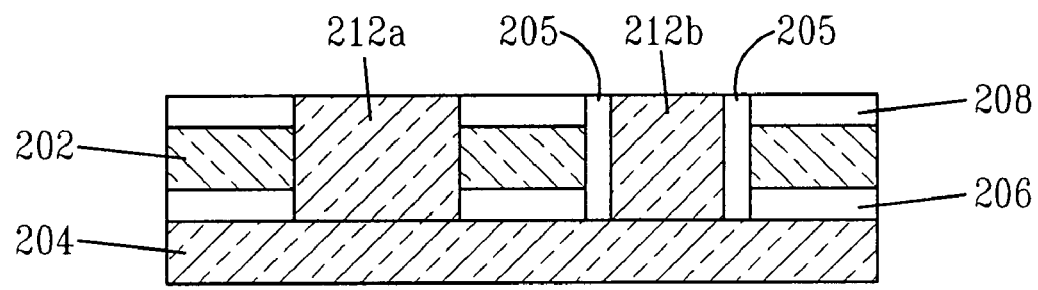
Figure 2F:
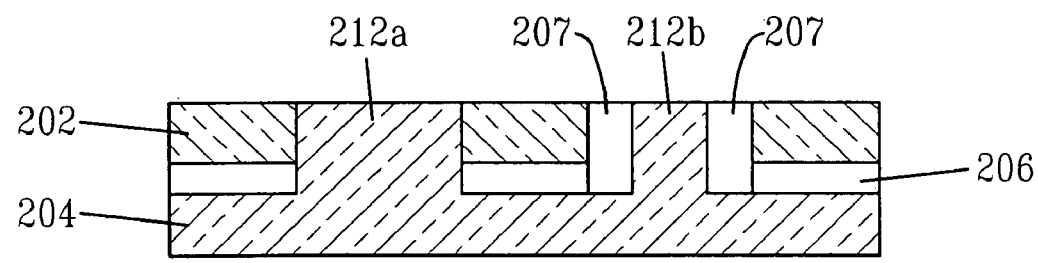

The structure shown in FIG. 2E is then subjected to a planarization process such as chemical mechanical polishing (CMP) or grinding, such that the upper surface of the semiconductor material 212 is substantially planar with the upper surface of the first semiconductor layer 202, as shown in FIG. 2F. Note that previously protected portion of surface dielectric layer 208 is removed during this planarization process.

After providing the substantially planar surfaces, an isolation region 207, such as a shallow trench isolation region, is typically formed so as to further isolate the region 212*b* from the first semiconductor layer 202. The isolation region 207 is formed utilizing processing steps that are well known to those skilled in the art including, for example, trench definition and etching, optionally lining the trench with a diffusion barrier, and filling the trench with a trench dielectric such as an oxide. After the trench fill, the structure may be planarized and an optional densification process step may be performed to densify the trench dielectric.

The planarized substrate surface as shown in FIG. 2F therefore comprises a first set of regions defined by the upper surface of the upper semiconductor layer 202 of the first crystal orientation, and a second set of regions defined by the upper surface of the regrown semiconductor material 212 of the second, different crystal orientation. More specifically, among the second set of regions, there are a first region 212*a* that is connected with the regions of the first crystal orientation, and a second region 212*b* that is isolated from the regions of the first crystal orientation.

Although the hybrid orientation substrate in FIG. 2F shows alternating SOI regions comprising a thin semiconductor layer formed on an insulating layer, and bulk semiconductor regions without any insulating layer underneath, the hybrid orientation substrate of the present invention is not so limited and may comprise primarily bulk semiconductor regions or primarily SOI regions, which can be readily configured by using different interfacial structures between the upper and lower semiconductor layers 202 and 204.

Figure 3:
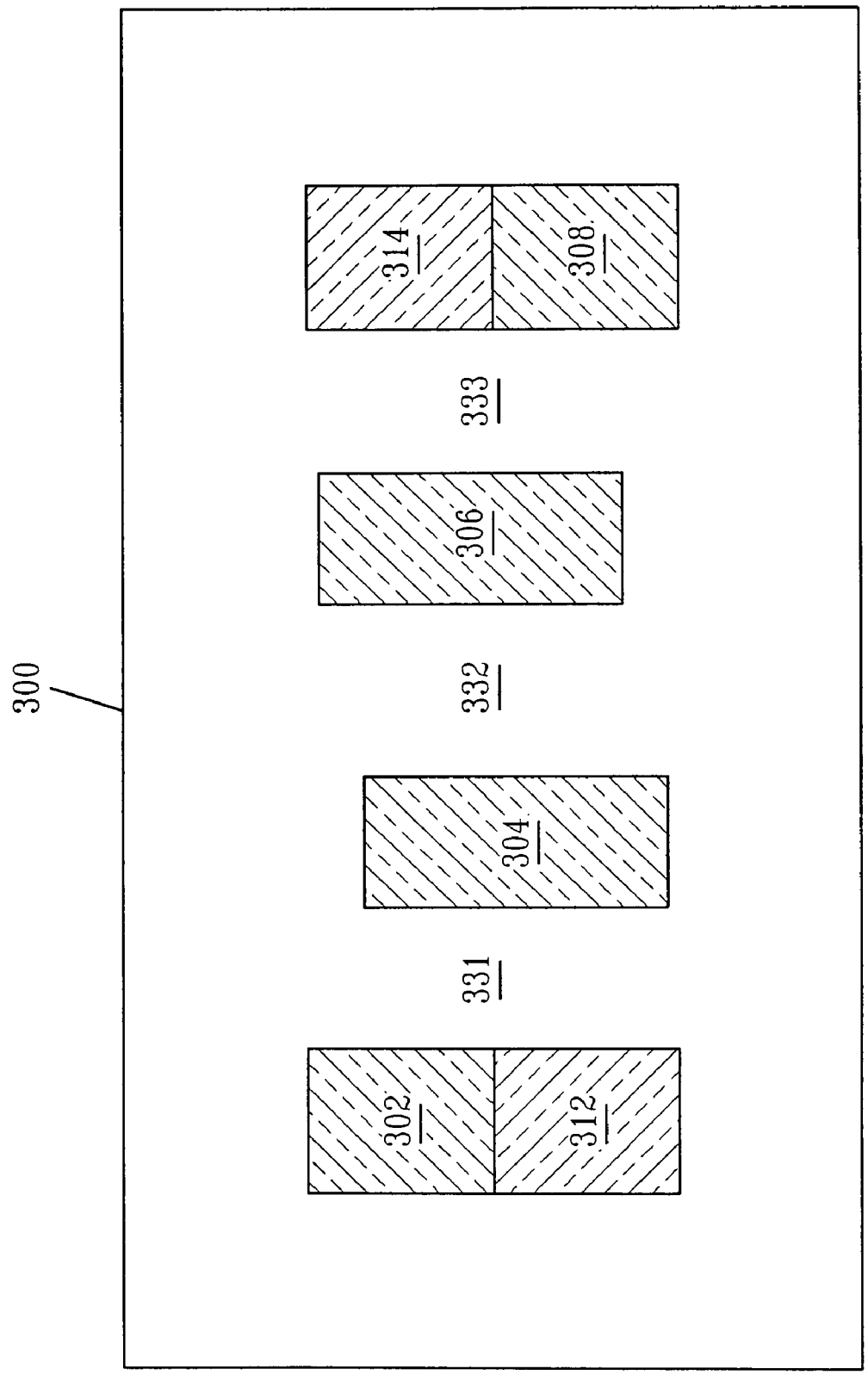
FIG. 3 shows the top view of an exemplary hybrid substrate that can be used to fabricate a SRAM cell, according to one embodiment of the present invention.

FIG. 3 shows a top view of an exemplary hybrid crystal orientation substrate 300, which contains a first set of regions 302, 304, 306, and 308 of a first crystal orientation, and a second set of regions 312 and 314 of a second, different crystal orientation. Among such first set of regions, 302 and 308 are connected (i.e., not isolated by any dielectric or insulating structures) with regions 312 and 314 of a different crystal orientation, while regions 304 and 308 are isolated from other regions by dielectric isolation regions 231-233.

For silicon-based hybrid crystal orientation substrate, it is preferred that the first and second crystal orientations are selected from the group consisting of (100), (111), (110), (010), (001) and (210). More preferably, one set of regions in such silicon-based hybrid crystal orientation substrate have the (100) crystal plane, while the other set of regions have the (110) crystal plane, since the (100) and (110) surfaces provide maximum carrier mobility differential for silicon-based hybrid crystal orientation substrate. Alternatively, one set of regions in such silicon-based hybrid crystal orientation substrate may have the (100) crystal plane, while the other set of regions have the (111) crystal plane, etc.

Additional device isolation regions may also be formed within the first and second set of regions, to provide within-region isolation in the hybrid crystal orientation substrate. Such device isolation regions are similar to the isolation regions that separate the first and second sets of regions, and they can be provided by selectively etching trenches in the substrate utilizing a conventional dry etching process, such as reactive-ion etching (RIE) or plasma etching, in conjunction with conventional block masks. Alternatively, the device isolation regions may be field isolation regions and are formed by using a local oxidation of silicon process.

After formation of the device isolation structures, the hybrid crystal orientation substrate may be further planarized, and an optional densification process step may be performed to densify the trench dielectric in the device isolation structures.

An SRAM cell can then be formed in such a hybrid crystal orientation substrate, with its pull-down and pass-gate transistors fabricated in different regions of different crystal orientations, so as to enhance the beta ratio without providing different channel widths for such pull-down and pass-gate transistors. For example, when such a SRAM cell comprises pull-down and pass-gate transistors that are n-channel field effect transistors (nFETs), the pull-down transistors are preferably formed in one set of regions with a crystal orientation that enhances electron mobility, and the two pass-gate transistors are preferably formed in another set of regions with a different crystal orientation that degrades electron mobility. Alternatively, when the pull-down and pass-gate transistors of such a SRAM cell comprise p-channel field effect transistors (pFETs), the pull-down transistors are preferably formed in regions with a crystal orientation that enhances hole mobility, and the two pass-gate transistors are preferably formed in another set of regions with a different crystal orientation that degrades hole mobility.

Figure 4:
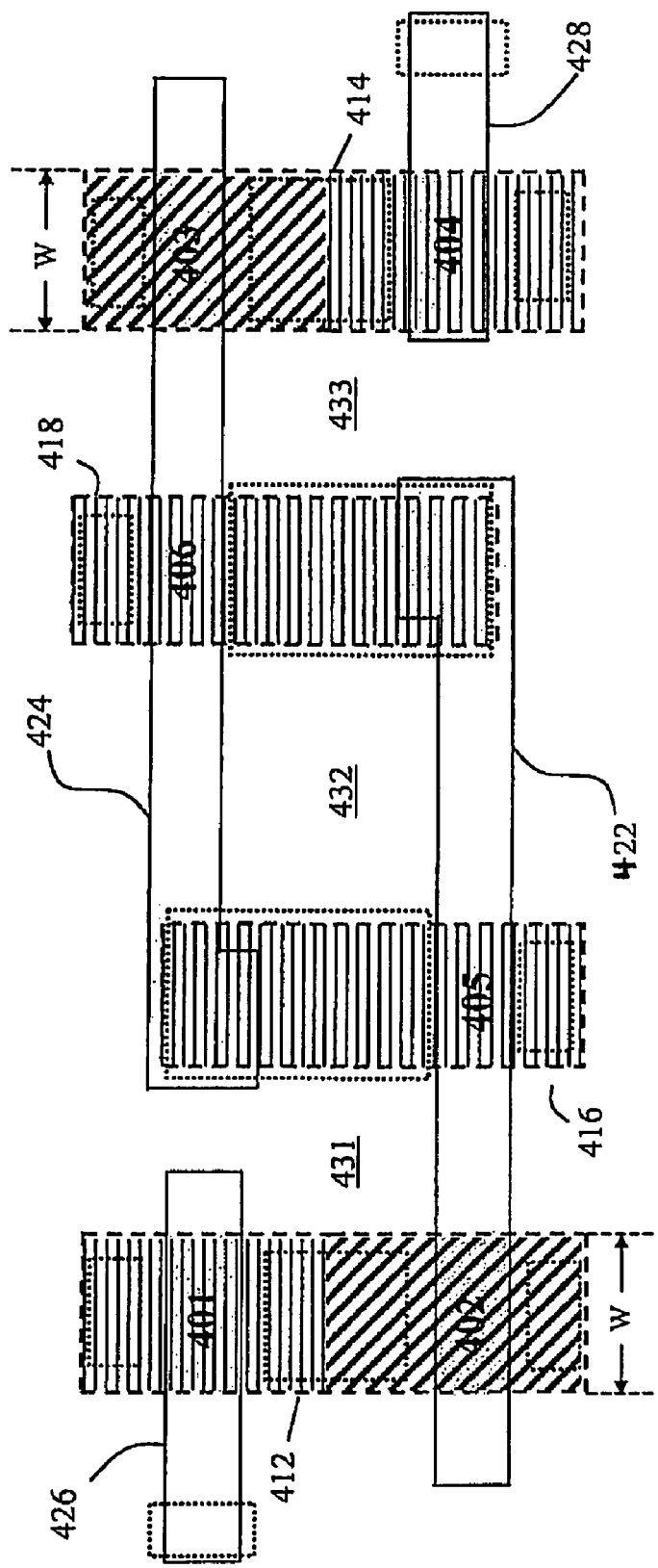
FIG. 4 shows the top view of an exemplary 6T-SRAM cell, according to one embodiment of the present invention.

FIG. 4 illustrative shows an exemplary SRAM cell of the present invention, as fabricated in a hybrid crystal orientation substrate, according to one embodiment of the present invention.

Specifically, pass-gate transistors 401 and pull-down transistors 402 are formed within a connected active region 412, with no isolation therebetween, and pull-down transistors 403 and pass-gate transistors 404 are formed within a connected active region 414. Further, pull-up transistors 405 and 406 are formed within active regions 416 and 418. The active regions 412, 414, 416, and 418 are formed within a semiconductor substrate, preferably be a silicon-containing substrate, and are separated from one another by dielectric isolation regions 431-433. Gate structures 422 and 426 are arranged above active region 412 to form gates of pull-down transistor 402 and pass-gate transistor 401, respectively. Similarly, above active region 414, gate structures 424 and 428 are arranged to form gates of pull-down transistor 403 and pass-gate transistor 404, respectively. Consequently, active regions 416 and 418 each have two gate structures 422 and 424 arranged above them.

In the embodiment of FIG. 4, the active region 412 (or 414) that forms the pass-gate transistor 401 (or 404) and the pull-down transistor 402 (or 403) has a first region of a first crystal orientation and a second region of a second crystal orientation, i.e., the respective active regions of the pass-gate transistor 401 (or 404) and the pull-down transistor 402 (or 403), although connected, have different crystal orientations. For example, if the pass-gate transistor 401 (or 404) and the pull-down transistor 402 (or 403) are nFETs, the pass-gate transistor region should have a crystal orientation (such as the (110) surface in silicon) that degrades electron mobility, and the pull-down transistor region should have a crystal orientation (such as the (100) surface in silicon) that enhances electron mobility. On the other hand, when the pass-gate transistor 401 (or 404) and the pull-down transistor 402 (or 403) are pFETs, the pass-gate transistor region should have a crystal orientation (such as the (100) surface in silicon) that degrades hole mobility, and the pull-down transistor region should have a crystal orientation (such as the (110) surface in silicon) that enhances hole mobility.

In such a manner, a carrier mobility differential is provided between the pass-gate transistor 401 (or 404) and the pull-down transistor 402 (or 403). The active regions 412 and 414 can therefore have the same channel width W throughout the entire length, without comprising the cell stability of the SRAM device.

The pull-up transistors 405 and 406 can be fabricated on semiconductor regions of any crystal orientation. For maximum cell performance, it is preferred that such pull-up transistors are formed in semiconductor regions having a crystal orientation that enhances the mobility of the specific type of charge carriers in such pull-up transistors. For example, if the pull-up transistors are pFETs, they should be formed in semiconductor regions having a crystal orientation (such as the (110) surface in silicon) that enhances hole mobility. On the other hand, if the pull-up transistors are nFETs, they should be formed in semiconductor regions having a crystal orientation (such as the (100) surface in silicon) that enhances electron mobility.

Although the above description is provided primarily in terms of planar SRAM cell structures, for simplicity and illustration purposes only, the present invention is not limited to planar SRAM cells, but is broadly applicable to other SRAM cell structures, such as vertical SRAM cells and trenched SRAM cells, with or without modifications and variations, as readily determinable by a person ordinarily skilled in the art according to the principles described herein. Various transistors as mentioned hereinabove can be readily prepared using conventional CMOS processing techniques that are well known to those skilled in the art, and therefore details concerning their fabrication are not provided herein.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device structure comprising at least one SRAM cell located in a hybrid substrate having a first portion with a first crystallographic orientation region and a second crystallographic region, wherein said at least one SRAM cell comprises at least two pull-up transistors, two pull-down transistors, and two pass-gate transistors, wherein the pull-down transistors are present in the first portion of the hybrid substrate having the first crystallographic orientation region that is connected through an active region that is in direct physical contact to the second crystallographic orientation region in which the pass-gate transistors are present, the first crystallographic orientation region having an upper surface coplanar with an upper surface of the second crystallographic orientation region and said first crystallographic region and said second crystallographic region comprise substrate materials of different composition, wherein the at least two pull-down transistors and the at least two pass-gate transistors are substantially similar in channel widths and have substantially similar source-drain doping concentrations, and wherein said at least one SRAM cell has a beta ratio of at least about 1.5.

2. The semiconductor device structure of claim 1, wherein carrier mobility in the second crystallographic orientation region differentiates from that in the first crystallographic orientation region by a factor of at least about 1.5.

3. The semiconductor device structure of claim 2, wherein current flow in the pull-down transistors is larger than that in the pass-gate transistors.

4. The semiconductor device structure of claim 1, wherein the first crystallographic orientation region and the second crystallographic orientation have a surface orientation that is selected from the group consisting of (100), (110), (111), (010), (001), and (210).

5. The semiconductor device structure of claim 1, wherein the first crystallographic orientation region comprises a (100) surface, and wherein the second crystallographic orientation comprises a (110) surface.

6. The semiconductor device structure of claim 1, wherein the first crystallographic orientation region comprises silicon-on-insulator thin film structures, and wherein the second crystallographic orientation comprise bulk silicon.

7. The semiconductor device structure of claim 1, wherein the first crystallographic orientation region comprises bulk silicon, and wherein the second crystallographic orientation comprise silicon-on-insulator thin film structures.

8. The semiconductor device structure of claim 1, wherein the hybrid substrate comprises one or more materials selected from the group consisting of Si, SiC, SiGe, SiGeC, Ge alloys, GaAs, InAs, and InP.

9. The semiconductor device structure of claim 1, wherein said at least one SRAM cell is selected from the group consisting of planar SRAM cells, vertical SRAM cells, and trenched SRAM cells.

10. The semiconductor device structure of claim 1, wherein at least one of the pass-gate transistors and one of the pull-down transistors of said SRAM cell are coplanar with each other and have connected active regions.

11. A semiconductor device structure comprising at least one SRAM cell located in a substrate, wherein said at least one SRAM cell comprises at least two pull-up transistors, two pull-down transistors, and two pass-gate transistors, wherein said substrate comprises a hybrid crystal orientation substrate having a first crystallographic orientation region that is connected through an active region that is in direct physical contact to a second crystallographic orientation region, the first crystallographic orientation region having an upper surface that is coplanar with an upper surface of the second crystallographic orientation region, and said first crystallographic region and said second crystallographic region comprise substrate materials of different composition, wherein the two pull-down transistors are located in the first crystallographic orientation region, and the two pass-gate transistors are located in the second crystallographic orientation region, and wherein current carriers in the pull-down transistors have a higher mobility than those in the pass-gate transistors.

12. The semiconductor device structure of claim 11, wherein both the pull-down transistors and the pass-gate transistors of the SRAM cell comprise n-channel field effect transistors, wherein the first crystallographic orientation region of the hybrid crystal orientation substrate comprises silicon with a (100) surface, wherein the second crystallographic orientation region of said hybrid crystal orientation substrate comprises silicon with a (110) surface.

* * * * *